United States Patent [19]

Vermilyea

[11] Patent Number: 4,698,611

[45] Date of Patent: Oct. 6, 1987

[54] PASSIVE SHIMMING ASSEMBLY FOR MR MAGNET

[75] Inventor: Mark E. Vermilyea, Schenectady, N.Y.

[73] Assignee: General Electric Company, Schenectady, N.Y.

[21] Appl. No.: 937,297

[22] Filed: Dec. 3, 1986

[51] Int. Cl.⁴ .............................................. H01F 3/00
[52] U.S. Cl. ..................................... 335/298; 335/301
[58] Field of Search .............. 335/211, 214, 296, 297, 335/298, 301, 304

[56] References Cited

U.S. PATENT DOCUMENTS

| 3,178,602 | 4/1965 | Meixner | 335/212 X |
| 3,643,191 | 2/1972 | Kasai et al. | 335/212 |
| 4,580,120 | 4/1986 | Jacquot | 335/214 X |
| 4,646,045 | 2/1987 | Chari et al. | 335/299 |

Primary Examiner—George Harris
Attorney, Agent, or Firm—William H. Steinberg; James C. Davis, Jr.; Marvin Snyder

[57] ABSTRACT

A passive shimming assembly is provided which allows flexible positioning of a plurality of arcuate segments of steel in the bore of a magnet, with enough degrees of freedom to adequately shim a magnetic resonance magnet to a level of inhomogeneity required for imaging without the use of correction coils.

12 Claims, 5 Drawing Figures

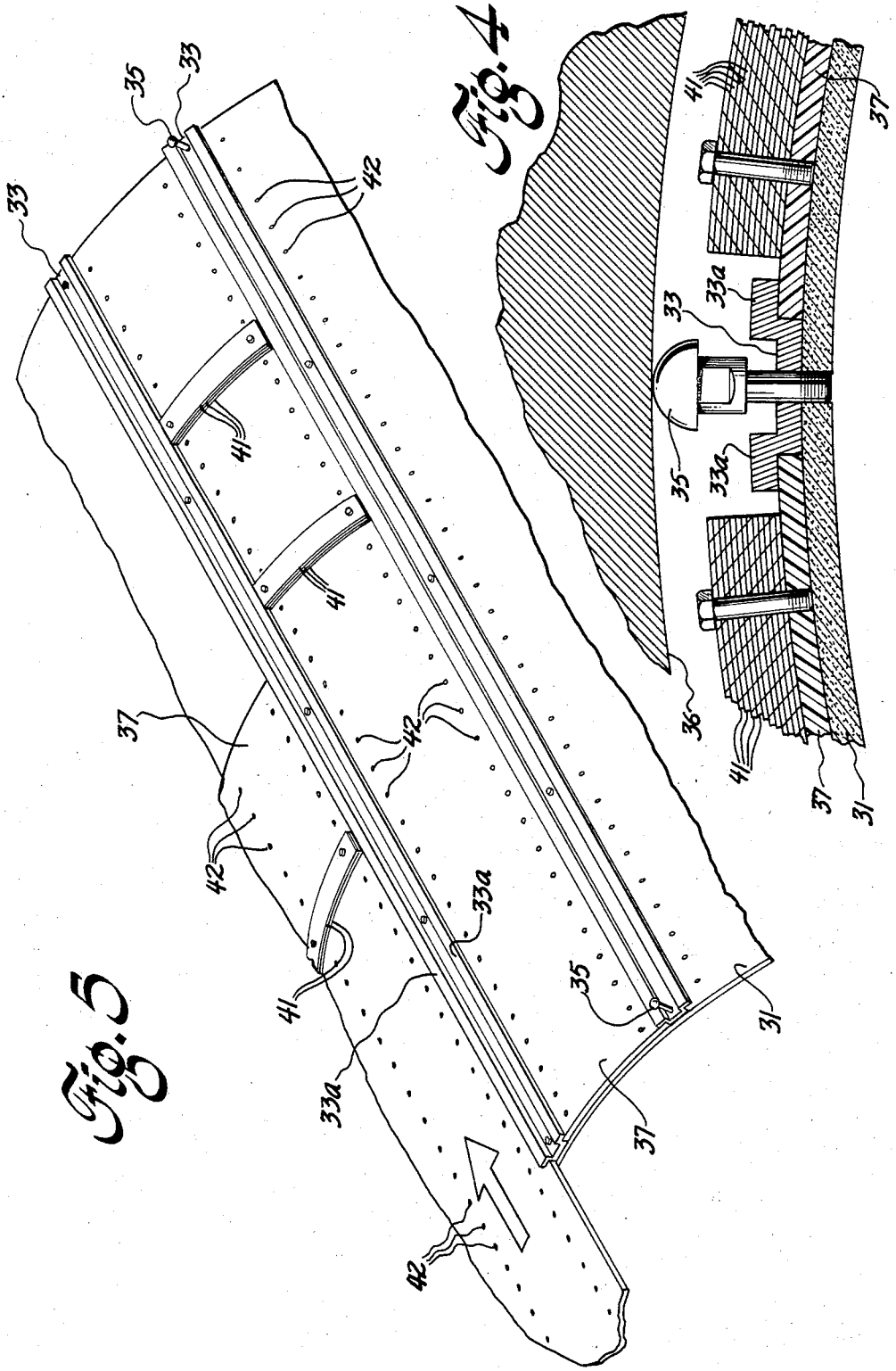

PASSIVE SHIMMING ASSEMBLY FOR MR MAGNET

CROSS REFERENCE TO RELATED APPLICATIONS

The present application is related to copending application Ser. No. 937,299 assigned to the same assignee as the present invention and is hereby incorporated by reference.

BACKGROUND OF THE INVENTION

The present invention relates to creating highly uniform magnetic fields in magnets used for magnetic resonance imaging, by the use of passive shimming to improve magnet field homogeneity.

To create a highly uniform magnetic field with an electromagnet or array of permanent magnets, it is necessary to build the magnet to a carefully specified shape, and to strive to minimize the deviations from the specified shape due to manufacturing variations. The resulting magnets, however, typically require field corrections to achieve the desired level of inhomogeneity, due to deviations of the magnet from the design or due to the presence of ferromagnetic material in the vicinity of the magnet.

To improve field uniformity, correction coils are typically used. These coils are capable of creating different field shapes which can be superimposed on an inhomogeneous main magnetic field to perturb the main magnetic field in a manner which increases the overall field uniformity. Unfortunately, many sets of such coils are typically required. A state of the art magnetic resonance (MR) imaging magnet has between ten and twenty independent sets of correction coils, each with its own power supply to provide the correct current flow. Naturally, these coils add significantly to the cost and complexity of the magnet.

Passive shimming is currently used to correct large deviations in magnetic fields that cannot be corrected by the available correction coils alone. The passive shimming is accomplished by placing a piece of iron in an appropriate place outside the magnet. The desired level of field uniformity can then be achieved by the correction coils.

It is an object of the present invention to provide a passive shimming assembly for a magnetic resonance magnet which can achieve a level of field inhomogeneity required for magnetic resonance imaging, without the use of correction coils.

It is a further object of the present invention to provide a shimming assembly which when used with a superconducting magnet can be adjusted without de-energizing the magnet.

SUMMARY OF THE INVENTION

In one aspect of the present invention a passive shim assembly for a magnet having a central bore is provided. The assembly comprises a nonmagnetic tube situated coaxially in the bore of the magnet and a plurality of arcuate strips of a predetermined length of ferromagnetic material demountably secured to the tube. The strips extend in the circumferential direction around the tube.

BRIEF DESCRIPTION OF THE DRAWING

While the specification concludes with claims particularly pointing out and distinctly claiming the present invention, objects and advantages of the invention can be more readily ascertained from the following description of preferred embodiments when used in conjunction with the accompanying drawing in which:

FIG. 4 is a partial sectional end view of the shimming assembly of FIG. 3 situated in the bore of a magnetic resonance magnet; and FIG. 5 is a partial isometric view of the passive shimming assembly of FIG. 3 showing one of the removable drawer sections being slid into place in the passive shim assembly.

DETAILED DESCRIPTION OF THE DRAWING

Figure 1:
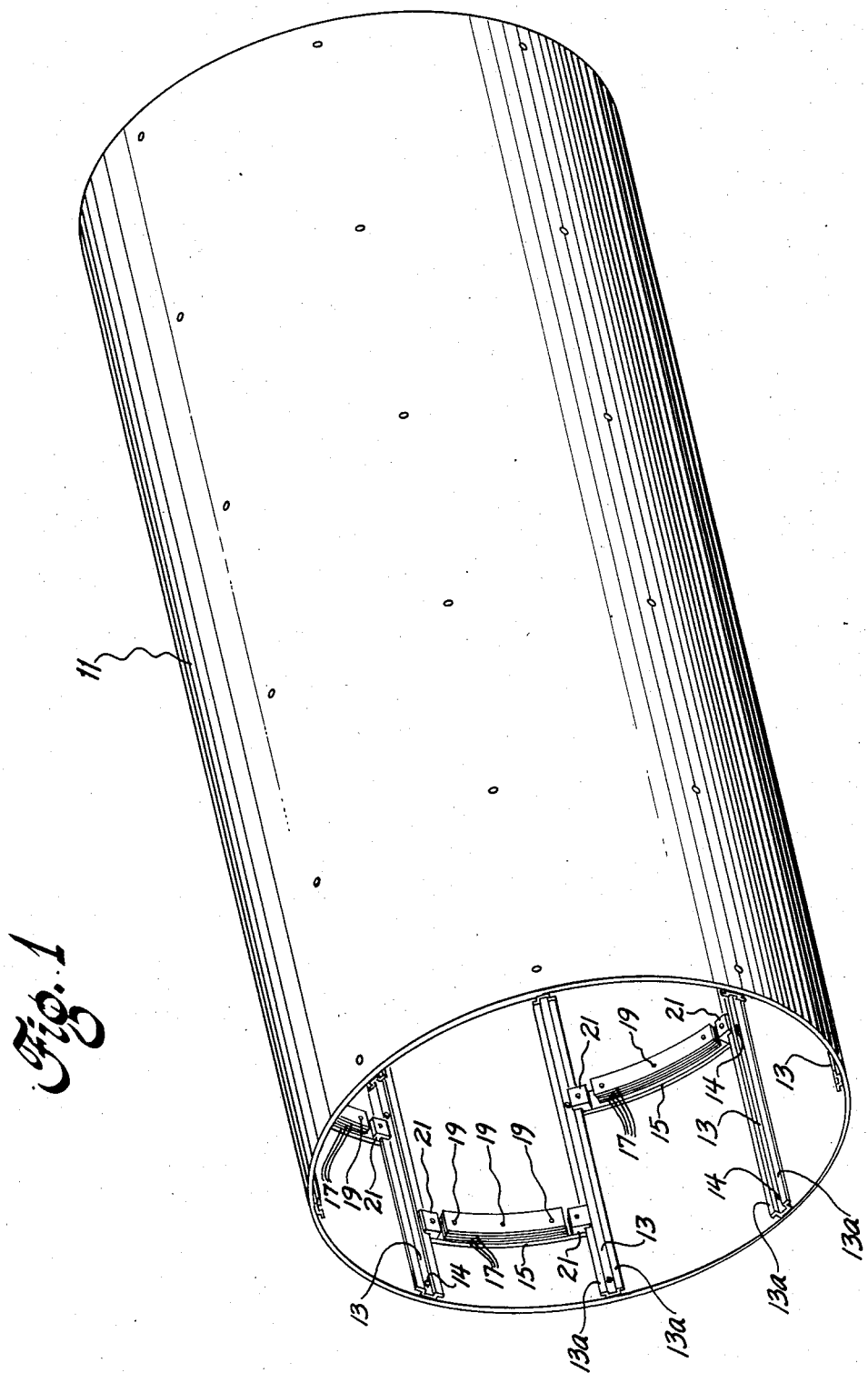
FIG. 1 is an isometric view of a passive shimming assembly in accordance with one embodiment of the present invention.

Referring now to the drawing and particularly FIG. 1 thereof, a passive shim assembly comprising a nonmagnetic thin wall tube 11 is shown. In the present invention the tube is fabricated of fiberglass creating a tube with a ⅛" wall thickness. A plurality of longitudinally extending nonmagnetic channel pieces 13 are equally circumferentially spaced about the interior of the tube 11. The channel pieces extend the length of the tube and are secured thereto by screws 14 threadingly engaging the fiberglass tube. The channel pieces each have two projecting edges 13a extending on either side of the channel. The edges are parallel to the tube and spaced away therefrom. The edges extend the longitudinal length of the tube. The channel pieces can be fabricated by extruding aluminum to the desired shape or if eddy currents are a problem, the channel pieces can be pultruded from composite material. Pultrusion is a process in which continuous filaments are drawn through an orifice, which also meters out encapsulating resin such as a thermoplastic.

Arcuate carrier pieces 15 of nonmagnetic material, such as fiberglass, are slidably mounted between the two adjacent channels with the projecting edges 13a of two adjacent channels preventing radial movement of the carrier pieces 15. Ferromagnetic strips 17, which provide the shimming, are stacked to the desired height on the carrier pieces with the strips having a length less than the length of the arcuate carrier pieces. The ferromagnetic strips can comprise 0.010 inch thick low carbon steel, cut to an axial width of 2 cm. and a circumferential extent at their mean radius of 30 degrees for a 1 meter bore magnet. The strips are secured to the arcuate carrier pieces such as by threaded fasteners 19.

Figure 2:
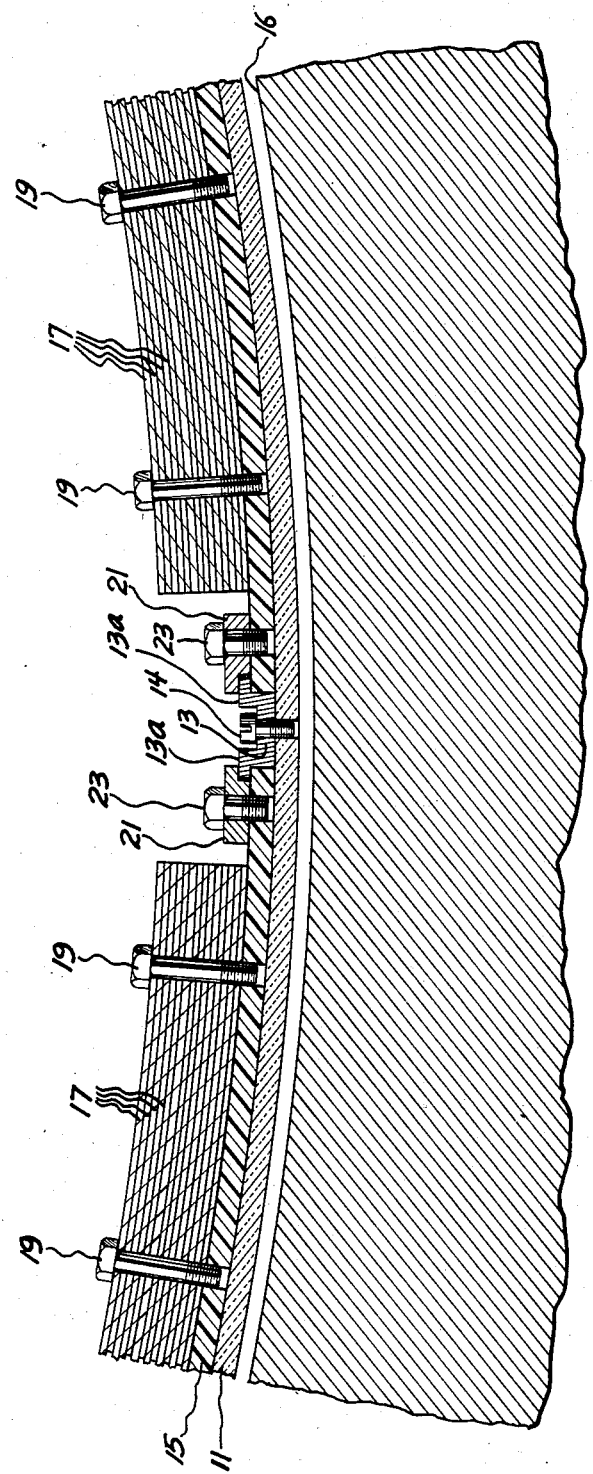
FIG. 2 is a partial sectional end view of the shimming assembly of FIG. 1 situated in the bore of a magnetic resonance magnet.

The carrier pieces are anchored in their longitudinal position by clamps 21 which can be fabricated from aluminum. The clamps, which can be more easily seen in FIG. 2, when tightened by bolts 23 to the arcuate carrier piece, captures a portion of the edge 13a of channel 13 between the clamps and the arcuate carrier piece fixing the longitudinal position of the ferromagnetic strips.

The passive shimming assembly is situated in the bore 16 of a magnet with the tube sized to fit against the bore sides. Spacers can be used to aid in centering of the tube in the bore. The radial thickness of the entire assembly is kept to a minimum to minimize interference with precious bore space, which is also occupied by gradient and RF coils and the patient table (which are not shown).

The axial position of the ferromagnetic strips are infinitely adjustable and very fine adjustment of the shim strength is available by changing the stack height of the strips. Thinner steel strips may be used to provide finer strength adjustment. The channels are placed every 45 degrees around the inner circumference of the bore allowing eight discrete circumferential locations for the ferromagnetic strips. The choice of circumferential locations in the present embodiment was selected to shim for spherical harmonics having degree m=2. Fields with m=2 vary sinusoidally with $2\phi$, where $\phi$ is the circumferential angle. Therefore such fields have peaks or nodes every 45° circumferentially. Providing capability of placing shims every 45° will clearly allow shimming of the m=2 harmonics.

The maximum axial force on a 1 cm. thick shim with the magnet energized is about 20 pounds in a 0.5 T magnet. The shim carrier could be moved when the clamps are loosened while making adjustment of the axial locations. A handle could readily be made which would allow easy control of the shim carrier with the clamps loose.

Figure 3:
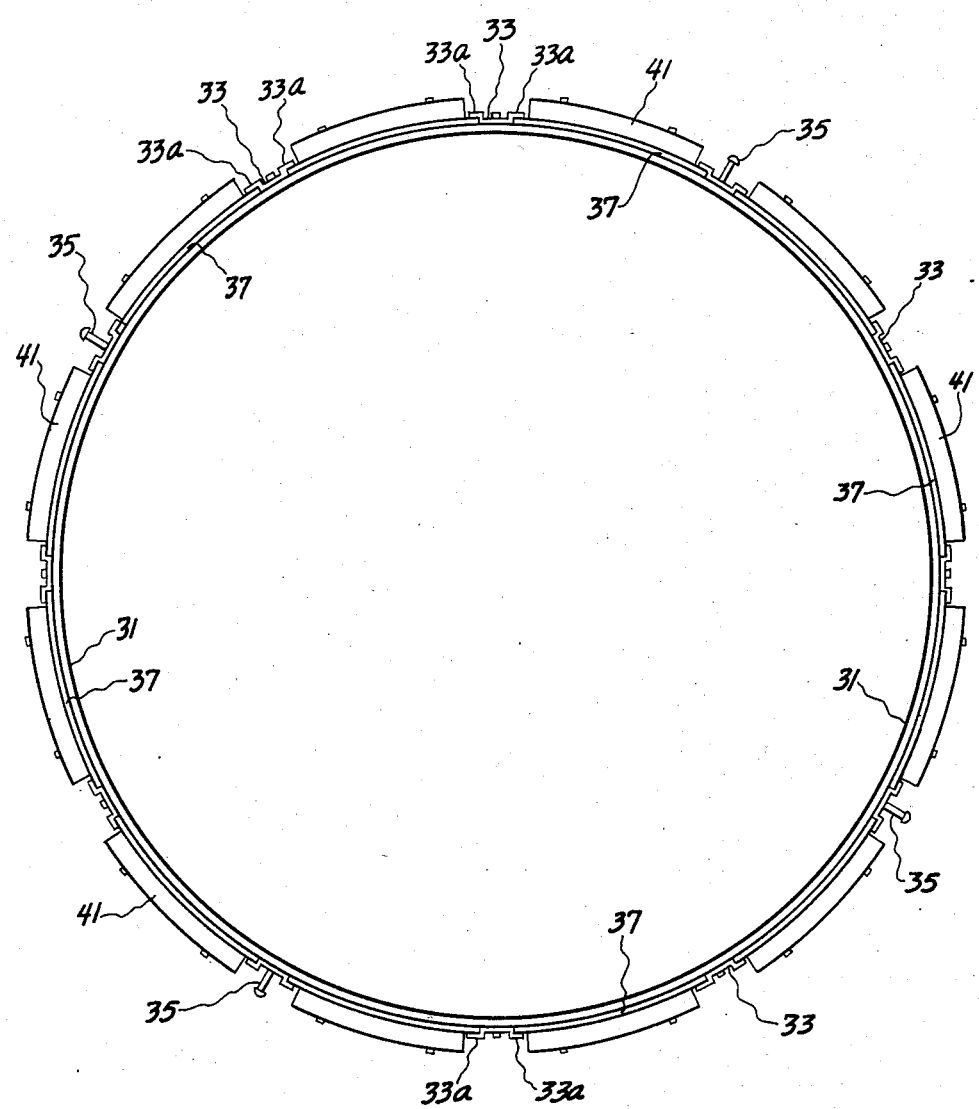
FIG. 3 is an end view of a passive shimming assembly in accordance with another embodiment of the present invention.

Referring now to FIG. 3 another embodiment of the present invention is shown. A passive shim assembly comprises a nonferromagnetic thin wall tube 31, which in the preferred embodiment is fabricated of fiberglass material ⅛" thick. A plurality of channel pieces 33 are equally spaced about the exterior of the tube. The channel pieces extend the length of the tube and are secured thereto by screws threadingly engaging the fiberglass tube 31. Some of the screws 35 located at the ends of the channel extend above the channel pieces surface to position the tube concentrically in the bore 36 of a magnet. This can be more clearly seen in FIG. 4. The channel pieces have projecting edges 33a on either side of the channel, extending away from the channel. The edges are parallel to the tube and spaced away therefrom. The edges extend the longitudinal length of the tube. The channel pieces can be fabricated by extruding aluminum to the desired shape or if eddy currents are a problem, the channel can be pultruded from composite material. The channels are shown placed every 30 degrees around the outer circumference of the bore allowing twelve discrete circumferential locations for the ferromagnetic strips. Increasing the number of circumferential locations provides greater flexibility in eliminating tesseral (axiperiodic) harmonics.

Arcuate shaped drawer pieces 37, as shown in FIG. 5, fit between adjacent edges 33a and extend the length of the tube. Ferromagnetic strips 41, which serve as the shims, are stacked to the desired height on the drawers and secured to the drawers using selected predrilled holes 42. With more axial holes provided finer axial field adjustability of the shims can be obtained. The FIG. 1 embodiment provides infinite adjustment, which might be desirable in some situations. The number of ferromagnetic strips provides an adjustment of strength. The radial thickness of the shims is kept to a minimum so that the shims fit in the space provided by the adjustable height of the extended screws 35. The drawers can slide out of the bore of the magnet to permit adjusting the axial position and thickness of the ferromagnetic strips. The drawers can be removed with the magnet energized and the ferromagnetic strip positions adjusted.

The position and thickness of the shims in the bore of the magnet are used to create magnetic field shapes which correct for inhomogeneities in the field created by the magnet. Flexibility in positioning the steel strips is therefore important, so that all the field shapes needed to counteract fields which could preclude imaging quality homogeneity can be obtained. Since it is doubtful that the initial prediction of the locations of the shim pieces will be perfect, the adjustability of the steel shims is important. Arcuate shims in specific locations are not intended to eliminate specific harmonics. Rather, the combination of all the arcuate shims together are intended to increase the field homogeneity. In situations where required shim height would interfere with available bore space wider shims can be used in both embodiments.

The shimming assembly is suitable for use in magnets having a central bore. The magnets can be electromagnetic including superconducting or the permanent magnet type. A method for determining the location and thickness of the shims is shown and claimed in copending application Ser. No. 937,299.

The foregoing has described a passive shim assembly which can achieve a level of field homogeneity required for magnetic resonance imaging, without the use of correction coils. The shim assembly when used with a superconducting magnet can be adjusted without de-energizing the magnet.

While the invention has been described with respect to preferred embodiments, it will be apparent that certain modifications and changes can be made without departing from the spirit and scope of the invention. It is therefore to be understood that the appended claims are intended to cover all such modifications and changes as fall within the true spirit of the invention.

What is claimed is:

1. A passive shim assembly for a magnet having a central bore, comprising:
    a nonmagnetic tube situated coaxially in the bore of the magnet; and
    a plurality of predetermined length arcuate strips of ferromagnetic material demountably secured to said tube, said strips extending in the circumferential direction around said tube.

2. The apparatus of claim 1 wherein said strips are secured to the exterior of said tube.

3. The apparatus of claim 1 further comprising means for coaxially situating said tube in said bore.

4. The apparatus of claim 2 wherein all of said strips have the same length.

5. The apparatus of claim 4 wherein said strips are secured as stacks of strips of varying heights at different locations about said tube.

6. The apparatus of claim 1 wherein said strips are secured to the interior of said tube.

7. The apparatus of claim 6 wherein all of said strips have the same length.

8. The apparatus of claim 7 wherein said strips are secured as stacks of strips of varying heights at different locations about said tube.

9. A passive shim assembly for a magnet having a central bore comprising:
    a nonmagnetic tube situated coaxially in the bore;
    a plurality of channel numbers secured to the interior of said tube, said channel members being equally spaced circumferentially and extending in a longitudinal direction;

a plurality of arcuately shaped carrier pieces slidably mounted between adjacent channel pieces;

clamp means to secure said carrier to said channels to prevent sliding motion; and a stack of predetermined length strips of magnetic flux conducting material demountably secured to each of said carrier pieces, said strips extending in the circumferential direction.

10. The apparatus in claim 9 wherein said carrier pieces said channel members and said clamp means each comprise nonmagnetic materials.

11. A passive shim assembly for a magnet having a central bore comprising:

a nonmagnetic tube situated coaxially in the bore;

a plurality of channel members secured to the exterior of said tube, said channel members equally spaced circumferentially and extending in a longitudinal direction;

a plurality of arcuately shaped drawers slidably mounted between adjacent channel pieces;

a plurality of stacks of predetermined length arcuate strips of magnetic flux conducting material demountably secured to each of said drawers, said strips extending in the circumferential direction.

12. The apparatus of claim 11 further comprising means for coaxially situating said tube in the bore of the magnet.

* * * * *